United States Patent [19]

Tsuchiko

[11] 4,257,043
[45] Mar. 17, 1981

[54] MULTICHANNEL DISPLAY DEVICE

[75] Inventor: Masayoshi Tsuchiko, Zama, Japan

[73] Assignee: Tokyo Shibaura Electric Co., Ltd., Japan

[21] Appl. No.: 889,009

[22] Filed: Mar. 22, 1978

[30] Foreign Application Priority Data

Mar. 24, 1977 [JP] Japan .................. 52-32391

[51] Int. Cl.³ .............................................. G09G 1/08
[52] U.S. Cl. ................. 340/722; 324/121 R; 340/721; 340/731
[58] Field of Search ........... 340/324 A, 324 AD, 721, 340/722, 731, 747; 324/121 R

[56] References Cited

U.S. PATENT DOCUMENTS

| | | | |
|---|---|---|---|
| 3,406,387 | 10/1968 | Werme | 340/711 X |
| 3,585,440 | 6/1971 | Lee et al. | 340/324 AD |
| 3,641,554 | 2/1972 | Slavin | 340/324 A |
| 3,646,606 | 2/1972 | Buxton et al. | 340/324 A |
| 3,652,999 | 3/1972 | Hjort et al. | 364/900 |
| 3,665,454 | 5/1972 | Stoddard et al. | 340/731 |
| 3,765,009 | 10/1973 | Graves et al. | 340/324 A |
| 3,909,792 | 9/1975 | Harris et al. | 340/324 A |
| 3,971,011 | 7/1976 | Borchert | 324/121 R |

Primary Examiner—David L. Trafton
Attorney, Agent, or Firm—Finnegan, Henderson, Farabow, Garrett & Dunner

[57] ABSTRACT

Disclosed is a multichannel display device which is so constructed that the waveform of input signal of each channel displayed on the cathode ray tube may be enlarged or reduced in the horizontal sweep direction or the horizontal direction by setting a sampling time interval for sampling the input signal of the channel to store the same in a corresponding one of plural memory units provided for each channel, a reading time for reading a sampled data stored in the corresponding memory, and a horizontal sweeping speed or one-sweep time of a cathode ray tube for displaying the waveform of the input signal in accordance with the sampled data as read, so as to permit these three factors to have an interrelation determined with respect to the channel.

6 Claims, 4 Drawing Figures

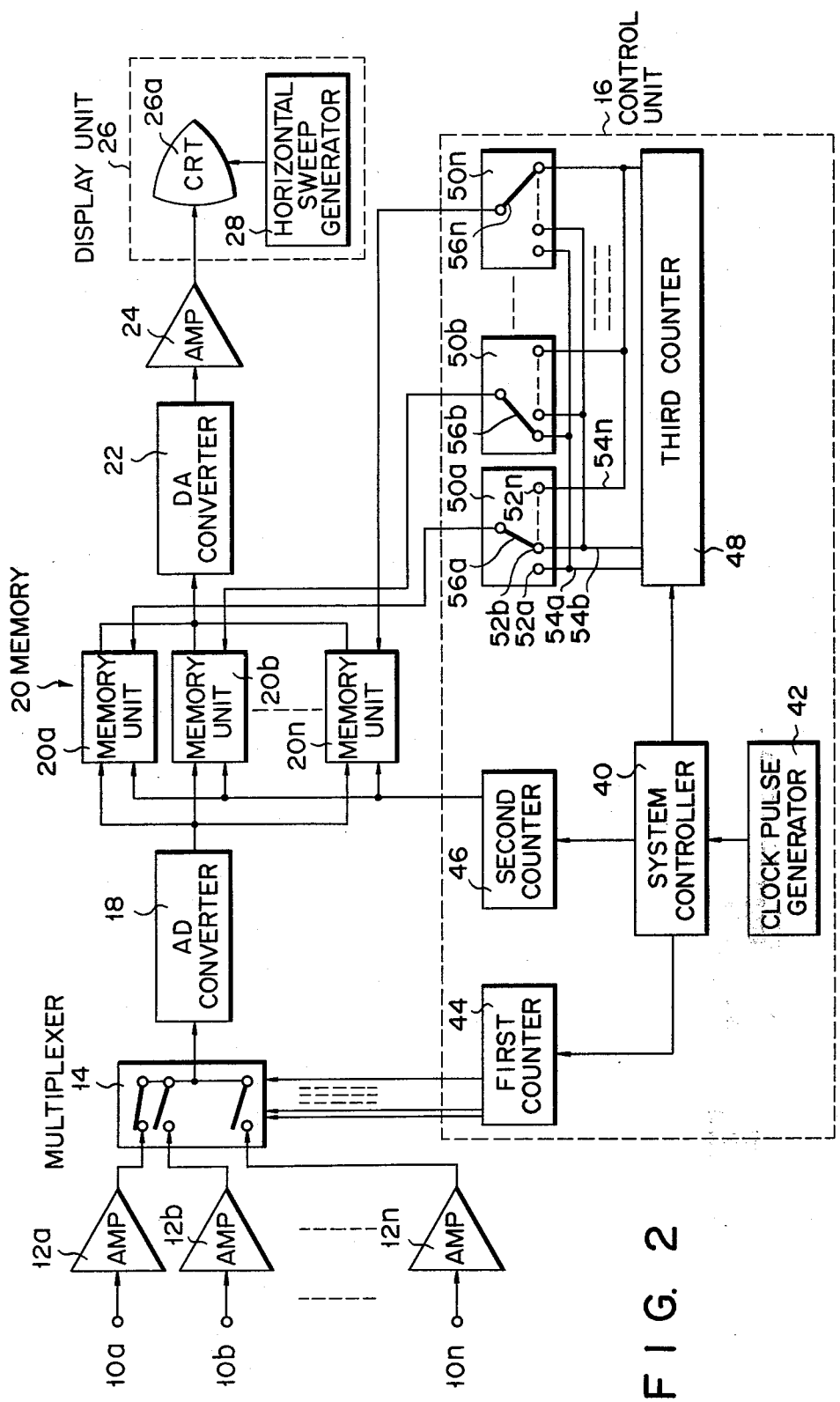
F I G. 2

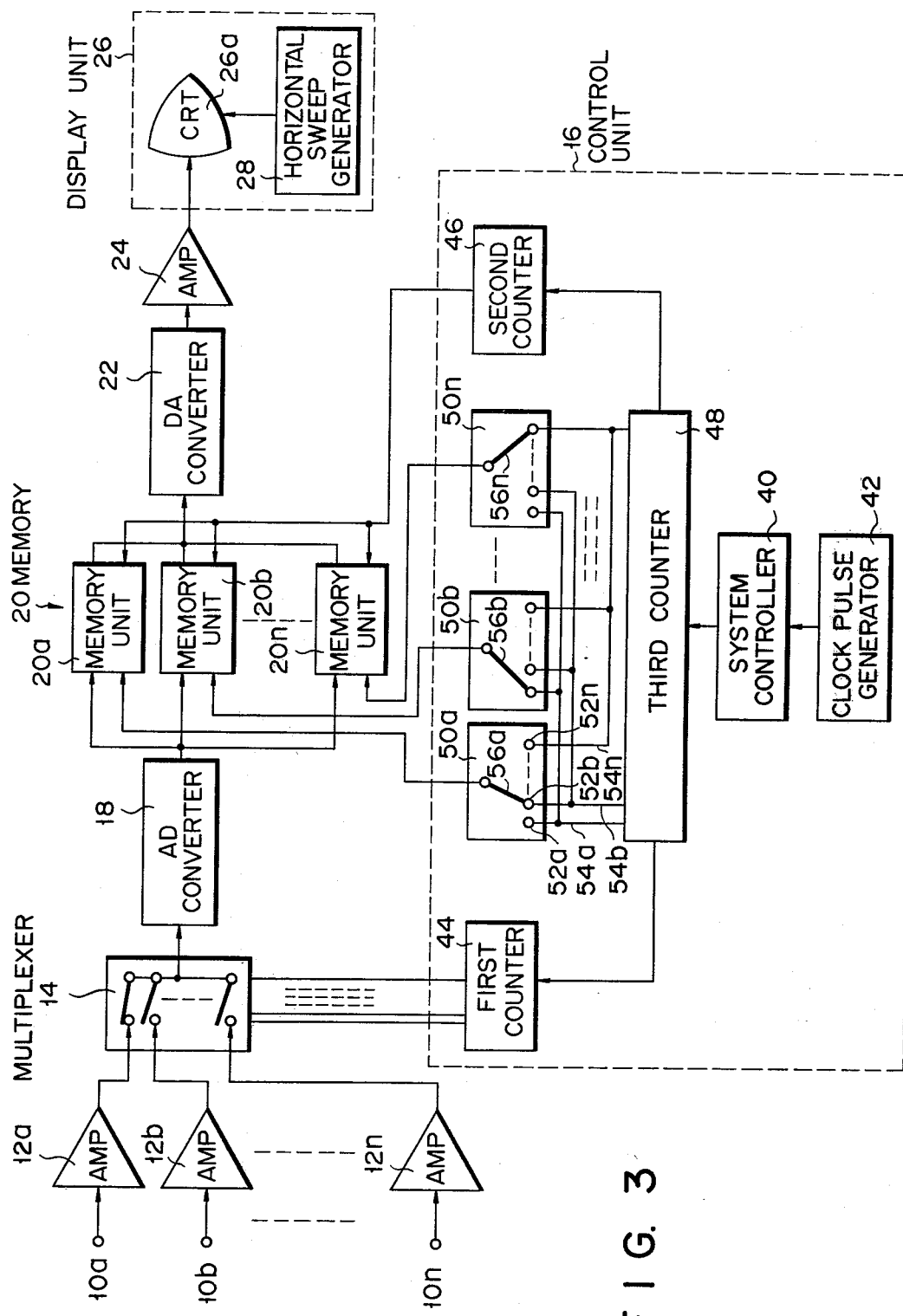
F I G. 3

MULTICHANNEL DISPLAY DEVICE

BACKGROUND OF THE INVENTION

This invention relates to a multichannel display device capable of storing in a memory sampling data obtained by sampled multichannel input signals, reading out such sampling data, and simultaneously displaying the input signals on a cathode ray tube (hereinafter referred to simply as CRT) in accordance with the read sampled data.

This type of multichannel display device has conventionally been known. The prior art device, however, is defective in that waveforms displayed on the CRT vary at different speeds with respect to the horizontal sweep—some very rapidly and others slowly—in simultaneously displaying rapidly changing input signals (high-speed phenomenon) and slowly changing input signals (low-speed phenomenon), which may be an obstacle to observation of shapes and changes on standing of the waveforms or comparative study of both said phenomena.

The reason for this is that in the prior art devices the input signals of the severla channels are sampled at the same time intervals for storage in the memory, the stored sampled data being read out at the same time intervals for all the channels, the respective input signals of the channels being displayed on the CRT all at the same horizontal sweep speed in accordance with the read sampling data.

SUMMARY OF THE INVENTION

An object of this invention is to provide a multichannel display device free from the aforesaid defects to which the prior art devices have been suject, and capable of displaying the waveform of the input signal of any channel to be displayed on a CRT independently of any other channel with enlarged or reduced length in the horizontal sweep direction (hereinafter referred to simply as horizontal direction).

In order to attain the above object, the multichannel display device of the invention comprises a memory for storing sampled data obtained from multichannel input signals, a sampling unit for sampling the multichannel input signals at sampling time intervals predetermined for each channel and storing the input signals in the memory, a data readout unit for reading out the sampled data stored in the meory at reading time intervals predetermined for each channel, and a display unit having a horizontal sweep signal generatorto produce horizontal sweep signals with horizontal sweep speeds predetermined for the several channels and displaying the waveforms of the respective input signals of the channels in accordance with the read-out sampled data; and is so formed that the respective waveforms of the input signals may be displayed with suitably enlarged or reduced horizontal length by setting the relation between the sampling time interval, the reading time interval, and the horizontal sweep speed or horizontal sweep time for each cycle (hereafter referred to simply as sweep time) with respect to each channel.

Typical examples of the device with varied relations between the sampling time interval, reading time interval, and sweep time are as follows.

A first example is a device in which the sampling time interval is set at a suitably short or long time for each channel in accordance with the speed of variation of the input signal, while the reading time interval and the horizontal sweep time are common to all the channels. According to such device, the waveforms of the input signals displayed on the CRT are enlarged in the horizontal direction as regards channel with shorter sampling time intervals, and reduced in the horizontal direction as regards channels with longer sampling time intervals.

A second example is a device in which the sampling time interval and the sweep time are common to all the channels, while the reading time interval is set at a suitably short or long time for each channel in accordance with the speed of variation of the input signal. Also according to such device, the waveforms of the input signals displayed on the CRT are enlarged in the horizontal direction for channels with shorter reading time intervals, and reduced for channels with longer reading time intervals.

A third example is a device in which the sampling time interval and the reading time interval are common to all the channels, while the sweep time is set at a suitable value for each channel in accordance with the change of speed of the input signal. Also according to such device, the waveforms of the input signals displayed on the CRT are horizontally enlarged for channels with shorter sweep time, and reduced for channels with longer sweep time.

According to the multichannel display device of this invention as described above, the multichannel input signals may be displayed on the CRT with suitably enlarged or reduced horizontal length, facilitating observation of the waveforms of the input signals as well as simultaneous comparison of the respective waveforms of the channels and study of the temporal relation between the waveforms. Therefore, the device of the invention is available for use in study or diagnosis of living bodies, for example. That is, a study of organic phenomena or diagnosis of a case may be achieved effectively by simultaneously displaying on the CRT an electrocardiogram to indicate the high-speed phenomenon among the organic phenomena and a respiration curve to indicate respiration, a low-speed phenomenon, in an easy size to observe.

BRIEF DESCRIPTION OF THE DRAWING

FIG. 2 is a block diagram showing another embodiment similar to the embodiment of FIG. 1 in which the sampling time interval is to be set for each channel;

FIG. 3 is a block diagram showing still another embodiment similar to the embodiment of FIG. 1 in which the reading time interval is to be set for each channel;

DETAILED DESCRIPTION OF THE PREFERRED EMBODIMENTS

Figure 1:
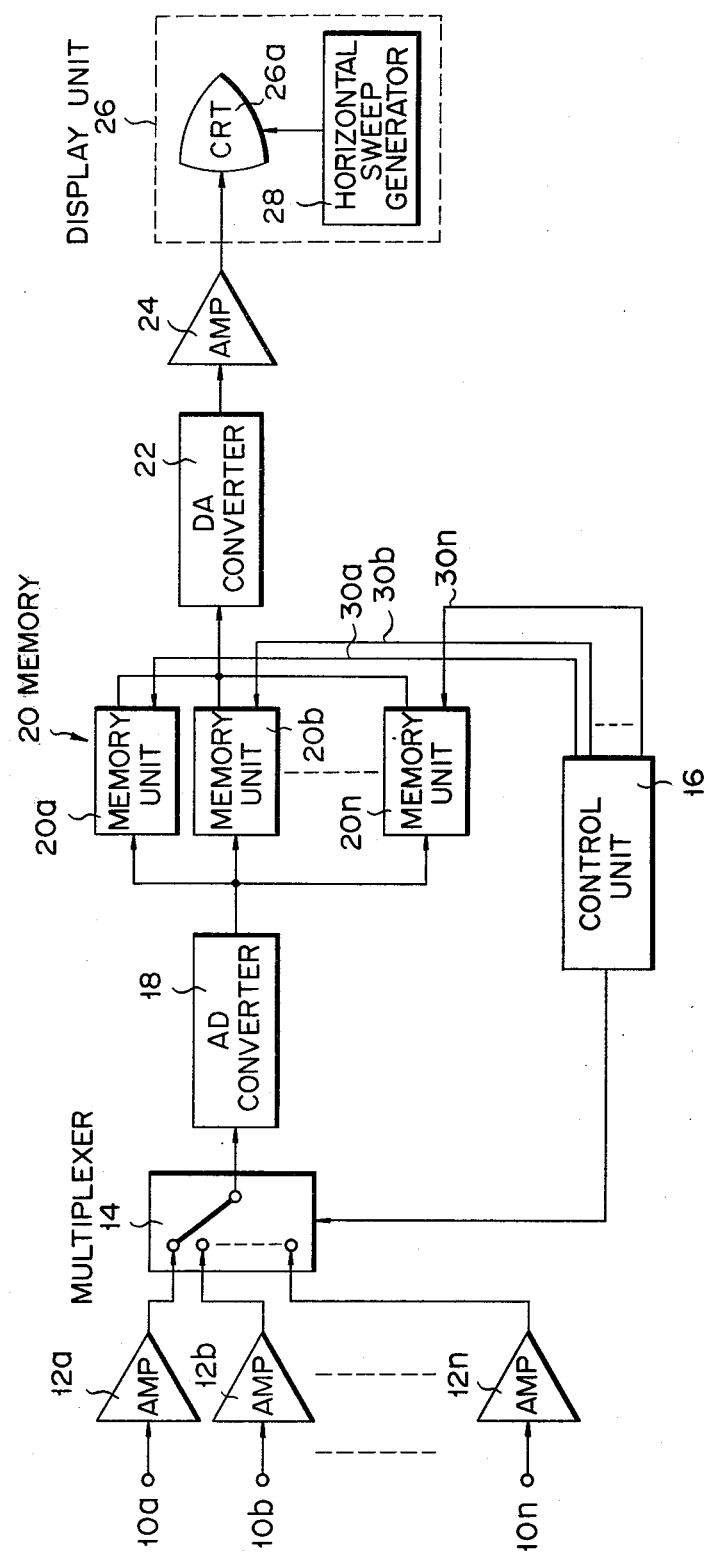
FIG. 1 is a block diagram showing an embodiment of the multichannel display device of this invention.

In an embodiment as shown in FIG. 1, a plurality of input signals which form multichannel input signals are supplied to input terminals $10a$, $10b$, ... and $10n$, respectively. These input signals are amplified by amplifiers $12a$, $12b$, ... and $12n$, respectively, and supplied to a multiplexer 14. The multiplexer 14 successively scans the several channels by means of a control signal from a control unit 16, and transmits analog sampling data for the input signals of the respective channels to an AD converter 18, which converts the sampling data into digital data. These digital data, provided for the respective channels, are led to memory units 20a, 20b, ... and 20n which form a memory 20. The memory units 20a, 20b, ... and 20n, in accordance with a first command signal from the control unit 16, extract and store the digital data of their corresponding channels supplied from the AD converter 18 at time intervals predetermined for the individual channels or sampling time intervals. Also, in accordance with a second command signal from the control unit 16, the memory units 20a, 20b, ... and 20n successively read out the digital data stored in the memory units at time intervals predetermined for the individual channels or reading time intervals, and deliver these data to a DA converter 22. Analog sampling data transmitted from the DA converter 22 are amplified by an amplifier 24, and delivered to a display unit 26. A horizontal sweep signal generator 28 produces horizontal sweep signals with sweep speeds predetermined for several channels, and transmits them to a CRT 26a when the input signals of their corresponding channels are to be displayed. The CRT 26a successively receives the analog data and the horizontal sweep signals corresponding to the channels, and simultaneously displays the waveforms of the input signals of the respective channels.

In FIG. 1 the first and second command signals supplied from the control unit 16 to the memory units 20a, 20b, ... and 20n are indicated by a line with every memory unit for the simplicity of the drawing. These lines are denoted by 30a, 30b, ... and 30n.

In the multichannel display device of the invention with the above construction, a properly enlarged or reduced horizontal length of the waveform of the input signal of each channel may be displayed on the CRT by predetermining as required the sampling time interval, reading time interval, and sweep time according to the speed of the input signal variation.

FIG. 2 shows an embodiment in which the reading time interval and sweep time are set at the same values respectively with respect to all channels, whereas the sampling time interval is allowed to be changed with every channel according to the input signal. Referring now to FIG. 2 in which like reference numerals refer to the same members and units as those of FIG. 1, a system controller 40 produces control signals for controlling first, second, and third counters 44, 46 and 48 in accordance with the fixed timing based on clock pulses transmitted from a clock pulse generator 42.

The first counter 44 successively operates switches provided in the multiplexer 14 for the respective channels, sampling the input signals from the input terminals at sampling time intervals for each channel. The multiplexer 14 is an analog multiplexer formed of IC's or transistors.

The third counter 48 is a memory writing address register which produces a signal for storing the digital data transmitted from the AD converter 18 in a specified address at sampling time intervals predetermined for each channel. Connected between this counter 48 and the memory units 20a, 20b, ... and 20n are manual changeover switches 50a, 50b, ... and 50n, respectively. All these switches are of the same type and have their respective fixed contacts 52a, 52b, ... and 52n, which are supplied by means of connecting lines 54a, 54b, ... and 54n with writing signals as many as the channels transmitted from the third counter 48 at sampling time intervals predetermined for the individual channels. By operating movable arms 56a, 56b, ... and 56n to bring them into contact with any of their corresponding fixed contacts 52a, 52b, ... and 52n, writing signals corresponding to such fixed contacts may be supplied to their corresponding memory units. Consequently, the digital data transmitted from the AD converter 18 are extracted at sampling time intervals selected for each of the several channels, and stored in the memory units 20a, 20b, ... and 20n with respect to several channels respectively.

The second counter 46 is a memory reading address counter which is driven for operation by the system controller 40 and produces reading signals for transmitting the digital data stored in the memory units 20a, 20b, ... and 20n at reading time intervals common to all the channels.

Since the control unit 16 is so formed as aforesaid, the waveforms of input signals to indicate high-speed phenomena may be displayed with enlarged horizontal length and the waveforms of input signals to indicate low-speed phenomena may be displayed with reduced horizontal length. These displays are achieved by operating the changeover swiches 50a, 50b, ... 50n, supplying writing signals with shorter sampling time intervals to channels for input signals regardng high-speed phenomena to sample the input signals closely and supplying writing signals with longer sampling time intervals to channels for input signals regarding low-speed phenomena to sample the input signals roughly, storing the input signals in the memory units 20a, 20b, ... and 20n for the several channels respectively, and reading out the sampling data at reading time intervals common to all the channels by means of the reading signals from the second counter, even with the display unit so formed as to allow sweep at the same sweep for all the channels.

FIG. 3 shows another embodiment in which the horizontal length of displayed waveforms may be enlarged or reduced for each channel by means of the display unit including the CRT 26a allowing sweep at the same speed for all the channels. In FIG. 3 reference numeral identical with those of FIGS. 1 and 2 designate the corresponding members and units.

Referring now to FIG. 3, the second counter 46 supplies the memory units 20a, 20b, ... and 20n with writing signals synchronous with the sampling action of the multiplexer 14, allowing digital data corresponding to the data for the several channels sampled at the multiplexer immediately to be stored in the their corresponding memory units. In this case, the sampled data are stored in the corresponding memory units at sampling time intervals according to the multiplexer 14, and hence at the same sampling time interval determined with respect to each channel. Then, the switches 50a, 50b, ... and 50n are operated, and the digital data stored in the memory units are read out at reading time intervals predetermined for each channel in accordance to the speed of variation of the input signals.

In this case, the waveforms to indicate the so-called high-speed phenomena varying at a high speed may be enlarged in the horizontal direction and the waveforms to indicate the so-called low-speed phenomena varying at a low speed may be reduced in the horizontal direction by supplying reading signals at shorter reading time intervals to channels for the display of high-speed phenomena and supplying reading signals at longer reading time intervals to channels for the display of low-speed phenomena, with the CRT allowing horizontal sweep at the same sweep speed for all the channels.

Figure 4:
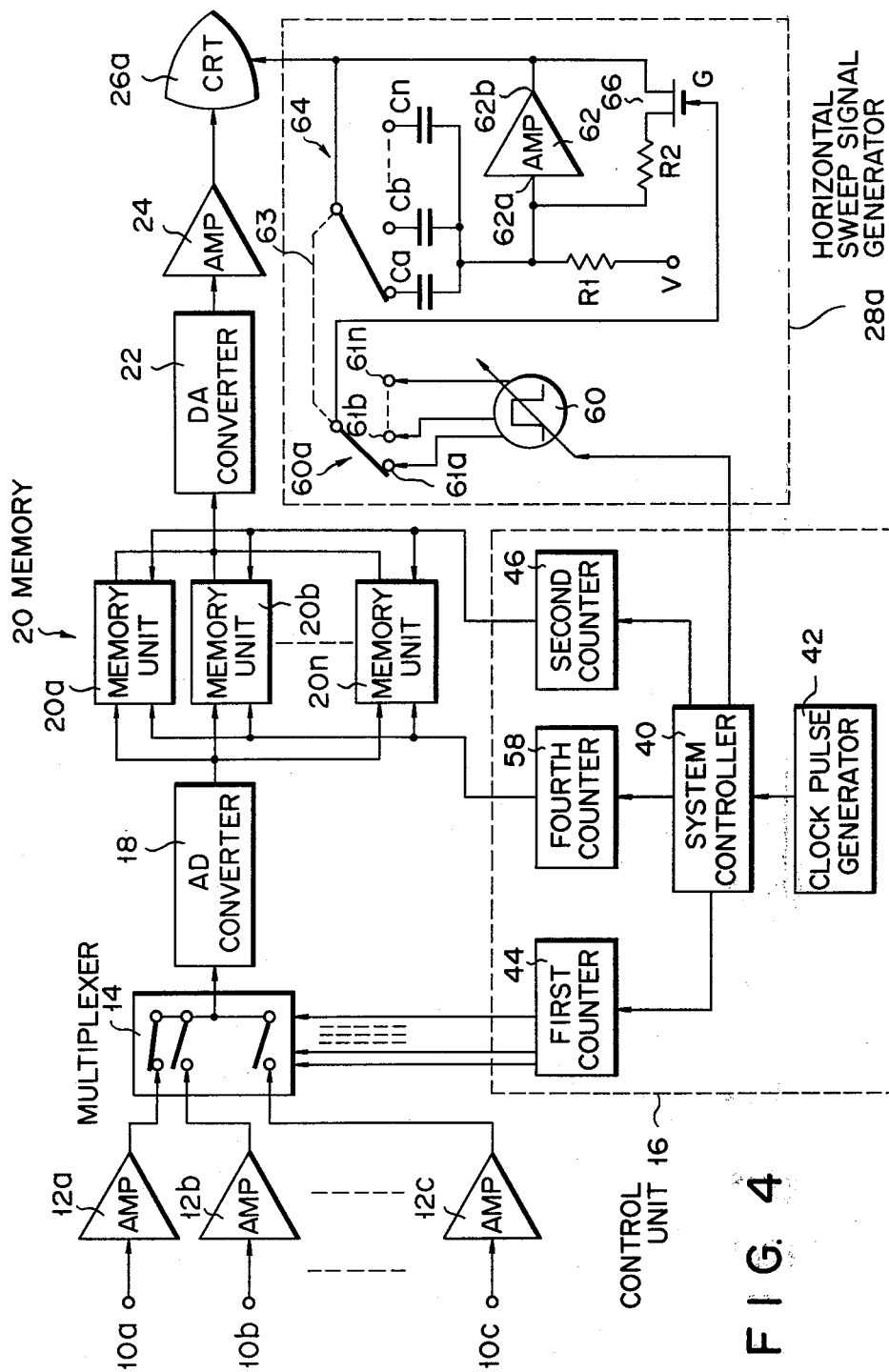
FIG. 4 is a circuit diagram serving partially as a block diagram showing an additional embodiment similar to the embodiment of FIG. 1 in which the sweep speed of a horizontal sweep signal to be supplied to a CRT is to be set for each channel.

Referring now to FIG. 4, there is provided the second counter 46 to supply writing signals at time intervals common to all the channels synchronously with the multiplexer driven by the first counter 44, in the same manner as the case of FIG. 3. The input signals are stored in the memory units 20a, 20b, . . . and 20n in the form of digital data at sampling time intervals corresponding to the sampling time intervals according to the multiplexer 14. A fourth counter 58 is driven for operation by the system controller 40 and supplies the several memory units with reading signals for reading out the digital data stored in the memory units 20a, 20b, . . . and 20n at reading time intervals common to all the channels. The read digital data of the respective channels are converted into analog data, and supplied to the CRT 26a as vertical deflection signals through the amplifier 24.

Now there will be described a horizontal sweep signal generator 28a used in this embodiment. In FIG. 4 numeral 60 denotes an oscillator to produce square-wave pulse signals with variable pulse width serving as synchronizing signals for horizontal sweep, while 62 designates an operational amplifier. Connected between the input and output terminals 62a and 62b of the amplifier 62 are a changeover switch 64 and capacitors Ca, Cb, . . . and Cn selected by the switch 64. Also connected in series between both these terminals 62a and 62b are a discharge resistance R2 and electronic switch 66 (MOS-type switching element shown in FIG. 4).

When the channel to be displayed on the CRT is switched, the oscillator 60 oscillates by means of the signal from the system controller 40 square-wave pulse signals at periods suited for producing a sweep speed selected for the corresponding channel among the sweep speeds predetermined for the several channels, the changeover switch 64 is driven at the same time to connect the capacitor (Ca in FIG. 4) corresponding to the specified channel between the input and output terminals 62a and 62b of the operational amplifier 62. The electronic switch 66 is closed while the square-wave pulse signals are being oscillated from the oscillator 60. R1 functions as an input resistance for the operational amplifier 62, and the output terminal 62b is connected to the CRT 26a. Although FIG. 4 includes a switch having a movable arm 60a and fixed contacts 61a, 61b, . . . and 61n to which the square-wave pulse signals for the respective channels are led and interlocking with the changeover switch 64 by means of a broken line 63 for the purpose of showing that the oscillator 60 generates square-wave pulse signals at the periods predetermined for the several channels on selection of the channel to be displayed, and the changeover switch 64 is driven engagedly therewith, electronic switches are actually used for both these switches.

When a direct voltage V is applied through the input resistance R1 to the input terminal 62a of the operational amplifier 62 of the horizontal sweep signal generator 28a with the abovementioned construction, the selected capacitor (Ca in FIG. 4) is charged at a time constant determined by the capacity of the capacitor Ca and the input resistance R1, and the terminal voltage of the capacity Ca is fed back to the operational amplifier, whereby a ramp voltage increasing substantially in a straight line is transmitted from the output terminal 62b. When the square-wave pulse signals are transmitted from the oscillator 60, they are supplied to the gate G of the MOS-type electronic switch 66 for a period of time equivalent to the pulse width, closing the switch 66 while in such period and discharging the capacitor Ca at the time constant determined by the capacity thereof and the level of the discharge resistance R2. Conseuently, the output voltage of the operational amplifier 62 drops. Since the discharge resistance R2 is so selected as to have a relatively low level, the output voltage drops rapidly. When the square-wave pulse signals from the oscillator 60 are extinguished the switch 66 is opened, charging of the capacitor Ca is started, the operational amplifier 62 again supplies the CRT 26a with a ramp voltage with the same waveform, and the CRT 26a receives the ramp voltage to perform horizontal sweep.

Thus, by previously suitably selecting the period of the square-wave pulse signals transmitted from the oscillator, capacitors Ca, Cb, . . . and Cn selected by the changeover switch 64, and the input and discharge resistances R1 and R2. When the channel to be displayed is selected, the CRT 26a may be caused to perform horizontal sweep with the sweep speed and hence the speed time and fly-back time, suitably predetermined for each channel, and the displayed waveforms for the several channels may be suitably enlarged or reduced in the horizontal direction in accordance with the speed of variation of the input signals.

While illustrative embodiments of this invention have been described in detail herein with reference to FIGS. 1, 2, 3 and 4, the waveforms of the respective input signals for the channels may be enlarged or reduced in the horizontal direction for the best observation in accordance with the speeds of variation of the input signals supplied to their corresponding channels, according to any of those embodiments, so that it is possible correctly to observe the waveforms of the respective input signals of a number of channels displayed on the CRT at the same time and easily to compare the waveforms with one another and observe the changes on standing. Since the device of the invention is provided with a memory, any phenomena that change quite slowly may be clearly displayed on the CRT. Thus, the device of the invention may be effectively used for studies by simultaneously displaying a number of signals from living bodies including input signals changing at varied speeds as well as for diagnoses of diseases.

What is claimed is:

1. A multiple display device comprising:
   means for sampling multichannel input signals;
   a memory having a plurality of memory units for storing sampled data received from said sampling means, the number of said memory units being the same as that of the number of channels;
   means for writing the sampled data into said memory units at common sampling time intervals;
   data readout means for reading out sampled data from said memory units at readout time intervals identical with said common sampling time intervals;
   display means for displaying the waveforms of said input signals;
   a horizontal sweep signal generator for producing and supplying to said display means a horizontal sweep signal whose frequency is varied in accordance with each respective multichannel signal; and
   channel switching means for simultaneously displaying said input signals means.

2. A multichannel display device according to claim 1, wherein said sampling means comprises a multiplexer for transmitting analog sampled data of each respective input signal of each channel; a first counter for driving said multiplexer by switching the channels; an AD converter for converting the sampled data into digital data; and a second counter for supplying write-in signals to each channel into the memory unit at the sampling time intervals synchronous with the operative of said multiplexer.

3. A multichannel display device according to claim 2, wherein said data readout means includes a third counter for supplying readout signals to each memory unit to read out the digital data from each memory unit at the readout time intervals identical with said sampling time intervals.

4. A multichannel display device according to claim 3, said horizontal sweep signal generator further including an oscillator for generating rectangular pulses having a period corresponding to the horizontal sweep velocity specific to the selected channel each time channel switching is effected, and ramp voltage generator means for generating ramp voltage when said oscillator produces no pulses and abruptly lowering the ramp voltage when said oscillator produces said pulses.

5. A multichannel display device according to claim 4, further comprising a control unit including a clock pulse generator and a system controller responsive to said clock pulse generator for driving said first, second and third counters and for controlling the frequency of the pulses generated by said oscillator according to the selected channel.

6. A multichannel display device according to claim 5, wherein said ramp voltage generator means comprises an operational amplifier; a circuit constituted by a plurality of first capacitors and a changeover switch for connecting one of the first capacitors between the input and output terminals of said amplifier when it selects one of channels, the number of said first capacitors being the same as that of said channels; a discharge register and gate means connected between the input and output terminals of said amplifier; a plurality of second capacitors for determining the frequency of the pulses generated by said oscillator, the number of capacitors being the same as that of the channels; and switch means for selecting one of the second capacitors most suitable for the selected channel.

* * * * *